United States Patent
Langhammer et al.

(10) Patent No.: US 11,101,925 B2
(45) Date of Patent: Aug. 24, 2021

(54) DECOMPOSABLE FORWARD ERROR CORRECTION

(71) Applicant: Intel Corporation, Santa Clara, CA (US)

(72) Inventors: Martin Langhammer, Alderbury (GB); Peng Li, Palo Alto, CA (US); Masashi Shimanouchi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 648 days.

(21) Appl. No.: 15/842,331

(22) Filed: Dec. 14, 2017

(65) Prior Publication Data

US 2019/0190653 A1 Jun. 20, 2019

(51) Int. Cl.
*H04L 1/00* (2006.01)
*H03M 13/15* (2006.01)
*H03M 13/00* (2006.01)

(52) U.S. Cl.
CPC ...... *H04L 1/0058* (2013.01); *H03M 13/1515* (2013.01); *H03M 13/616* (2013.01); *H03M 13/6516* (2013.01); *H04L 1/0061* (2013.01)

(58) Field of Classification Search
None
See application file for complete search history.

(56) References Cited

U.S. PATENT DOCUMENTS

| 5,144,304 A * | 9/1992 | McMahon | H04L 1/0042 341/58 |
| 5,396,239 A * | 3/1995 | McMahon | H04L 1/0042 341/58 |
| 7,788,570 B1 * | 8/2010 | Feng | H03M 13/1565 714/784 |
| 8,234,550 B2 * | 7/2012 | Dabiri | H03M 13/114 714/780 |

* cited by examiner

*Primary Examiner* — Phung M Chung
(74) *Attorney, Agent, or Firm* — Fletcher Yoder, P.C.

(57) ABSTRACT

Network communication systems may employ coding schemes to provide error checking and/or error correction. Such schemes may include parity or check symbols in a message that may add redundancy, which may be used to check for errors. For example, Ethernet may employ forward error correction (FEC) schemes using Reed-Solomon codes. An increase in the number of parity symbols may increase the power of the error-correcting scheme, but may lead to an increased in latencies. Encoders and decoders that may be configured in a manner to produce variable-length messages while preserving compatibility with network standards are described. Decoders described herein may be able to verify long codewords by checking short codes and integrating the results. Encoders described herein may be able to generate codewords in multiple formats without replicating large segments of the circuitry.

22 Claims, 11 Drawing Sheets

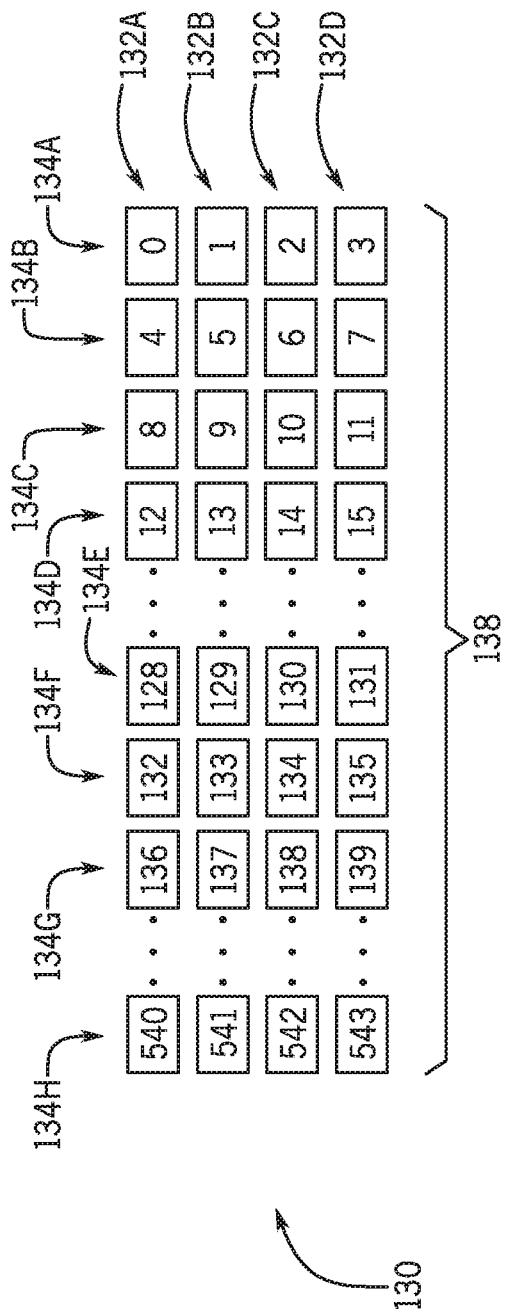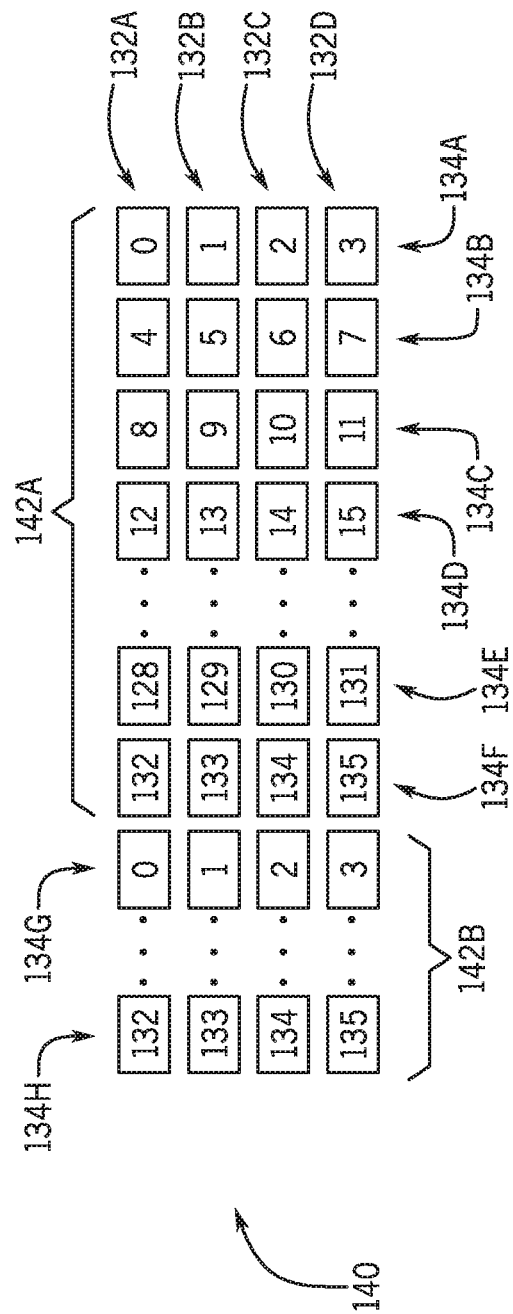

$$410 \quad\quad 412$$

$$\begin{bmatrix} 1 & 1 & 1 & 1 & 1 \\ 0 & 1 & 517 & 775 & 902 \\ 0 & 0 & 1 & 775 & 192 \\ 0 & 0 & 0 & 1 & 902 \\ 0 & 0 & 0 & 0 & 1 \end{bmatrix} \quad \begin{bmatrix} 1 & 0 & 0 & 0 & 0 \\ 16 & 24 & 0 & 0 & 0 \\ 256 & 320 & 240 & 0 & 0 \\ 36 & 548 & 850 & 952 & 0 \\ 576 & 612 & 22 & 899 & 782 \end{bmatrix}$$

FIG. 13A  FIG. 13B $$414 \quad\quad 416$$

$$\begin{bmatrix} 1 & 1 & 1 & 1 \\ 0 & 1 & 517 & 775 \\ 0 & 0 & 1 & 775 \\ 0 & 0 & 0 & 1 \end{bmatrix} \quad \begin{bmatrix} 1 & 0 & 0 & 0 \\ 8 & 12 & 0 & 0 \\ 64 & 80 & 60 & 0 \\ 512 & 576 & 360 & 119 \end{bmatrix}$$

FIG. 14A  FIG. 14B $$\begin{bmatrix} 1 & 1 & 1 & 1 & 1 & 1 & 1 & 1 \\ 0 & 1 & 517 & 775 & 902 & 450 & 224 & 113 \\ 0 & 0 & 1 & 775 & 192 & 950 & 811 & 812 \\ 0 & 0 & 0 & 1 & 902 & 950 & 198 & 53 \\ 0 & 0 & 0 & 0 & 1 & 450 & 811 & 53 \\ 0 & 0 & 0 & 0 & 0 & 1 & 224 & 812 \\ 0 & 0 & 0 & 0 & 0 & 0 & 1 & 113 \\ 0 & 0 & 0 & 0 & 0 & 0 & 0 & 1 \end{bmatrix}$$

FIG. 15

DECOMPOSABLE FORWARD ERROR CORRECTION

BACKGROUND

This disclosure relates to methods and systems for error correction in data communication, and more specifically, to low-latency forward error correction (FEC) encoding and decoding methods and systems to enable high reliability network communication.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Standards in network communication protocols are often used as they provide flexible communication between electronic devices at low cost. As an example, Ethernet networks may be quickly created by linking servers using off-the shelf, tested network interfaces. As a result, Ethernet networks may be found in short distance networks within a datacenter as well as between computers long distance networks in which servers may be separated several miles. In order to mitigate inefficiencies caused by data corruption, network protocols may include error checking (e.g., cyclic redundancy checking (CRC)) and/or error correcting schemes (e.g., Reed-Solomon, Bose-Chaudhuri-Hocquenghem (BCH)). Such schemes may operate by concatenating parity or check symbols to the messages to produce codewords that, when decoded, may allow a receiver to verify the integrity of the message, or correct it.

An increase in the number of parity or check symbols incorporated in a codeword may allow error detection or correction in messages with a large number of corrupted symbols, leading to improvements in the power of the error correcting scheme. However, the increase in the number of parity symbols may be accompanied by an increase in the complexity and/or latency in the encoder/decoder circuitry.

BRIEF DESCRIPTION OF THE DRAWINGS

Various aspects of this disclosure may be better understood upon reading the following detailed description and upon reference to the drawings in which:

FIG. 4A is an example of a time chart of a data stream, over 4 physical channels, that carries messages encoded using codewords having 544 symbols, in accordance with an embodiment;

FIG. 4B is an example of a time chart of a data stream, over 4 physical channels, that carries messages encoded using codewords having 136 symbols, in accordance with an embodiment;

FIG. 13A is an upper matrix of a decomposition of an error checking matrix that may be associated with a Reed-Solomon code in an RS (136,131) format, in accordance with an embodiment;

FIG. 13B is a lower matrix of a decomposition of an error checking matrix that may be associated with a Reed-Solomon code in an RS (136,131) format, in accordance with an embodiment;

FIG. 14A is an upper matrix of a decomposition of an error checking matrix that may be associated with a Reed-Solomon code in an RS (136,132) format, in accordance with an embodiment;

FIG. 14B is a lower matrix of a decomposition of an error checking matrix that may be associated with a Reed-Solomon code in an RS (136,132) format, in accordance with an embodiment;

FIG. 15 is a matrix that illustrates the relationship between the upper matrices that may result from a decomposition of error checking matrices associated with Reed-Solomon codes of a fixed codeword length, in accordance with an embodiment;

DETAILED DESCRIPTION OF SPECIFIC EMBODIMENTS

Figure 1:
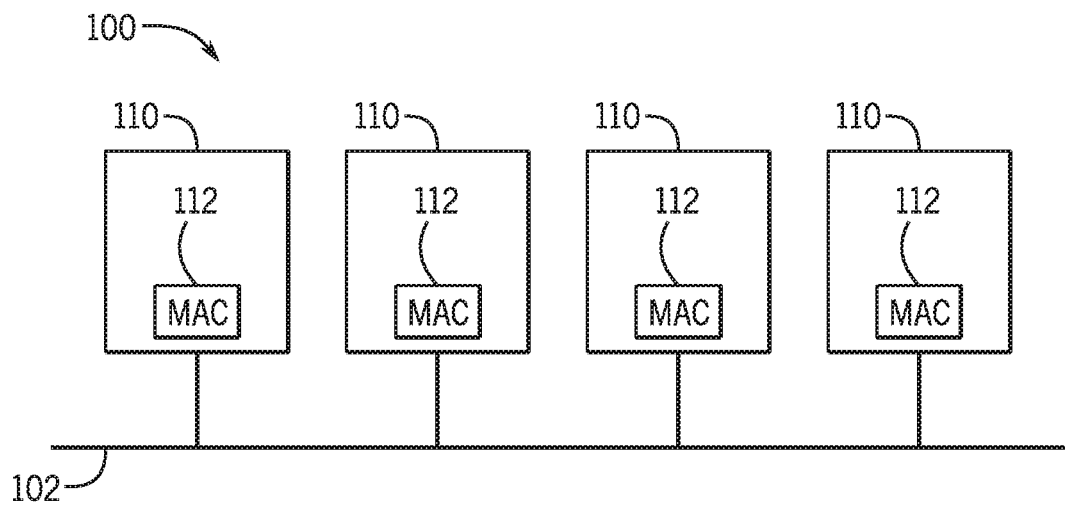
FIG. 1 is a schematic diagram of a low latency network of electronic devices coupled using an Ethernet protocol which may use decomposable forward error correction (FEC) schemes, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

In networks of electronic systems that couple multiple electronic devices, the network protocols employed in the network may specify error correction and/or detection schemes. For example, Ethernet networks may employ forward error correction (FEC) strategies to detect errors from data corruption during transmission of Ethernet packets over the network. In these FEC strategies, transmitted messages may include parity and/or check symbols that add redundancy to the messages and may be used by a receiver to identify corrupted messages and/or correct the messages. The parity symbols may be generated by coding schemes, such as the Bose-Chaudhuri-Hocquenghem (BCH) codes, of which Reed-Solomon (RS) codes are an example. These coding schemes may be particularly powerful for error correction as the check symbols may be generated to increasing the distance between messages (e.g., the distinctions between all potential messages within a dictionary, as defined by a metric such as a Manhattan distance metric), and thus increase the number of tolerated or allowed corrupted symbols. In general, the higher the number of check symbols relative to the size of the message block, the more powerful the code is.

The latency in communications may also be sensitive to the number of check symbols due to time for encoding and/or decoding. As such, there is a trade-off between tolerance for data corruption and communications latency. In certain applications, such as in networks over large distances, higher data corruption tolerance may be favorable, while in other applications, such as in data centers, lower latency may be favorable. Embodiments described herein are related to communication systems that can have a flexible, configurable error correction power, by describing FEC encoders and decoder that may efficiently produce or decode codewords in multiple FEC formats. In some embodiments, different FEC formats may be used, depending on the context of the communication, such as whether the expected destination of the message is a relatively close distance to or relatively far distance from the sending device.

To that end, the present disclosure discusses encoders and decoders for FEC codewords, which may be produced from the decomposition of the FEC code specified by a network protocol into smaller FEC codewords. As a result of the decomposable FEC schemes, the devices may use variable message lengths and/or variable number of check symbols while remaining compatible with the network protocol specification. The decomposable FEC schemes further allow encoders and decoders to have the flexibility without substantial replication of the subcomponents, as discussed below. Furthermore, in some implementations, the systems may include a handshake circuitry that performs a handshake process which may determine the specific FEC scheme to be used, increasing further the flexibility in the communication. As a result, the systems described herein may be used to provide network communication between systems, such as servers connected to a backplane Ethernet connection, to use low power FEC schemes while preserving compatibility with traditional higher-power FEC schemes.

Figure 2:
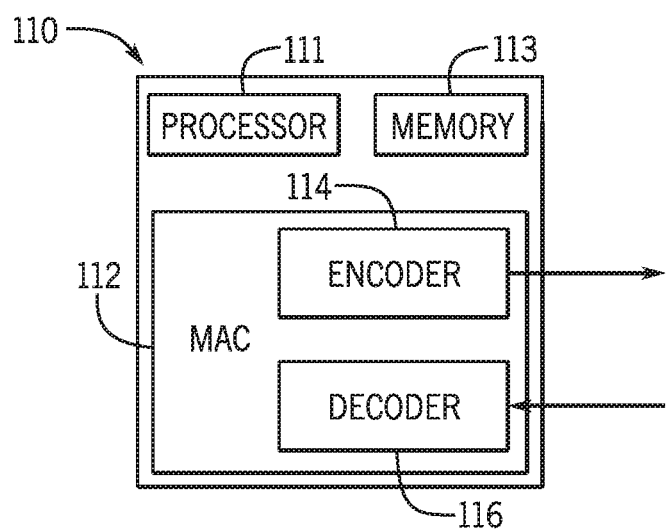
FIG. 2 is a schematic diagram of an electronic device that may be coupled to a network and may employ encoder/decoder circuitry to implement a decomposable FEC scheme, in accordance with an embodiment.

With the foregoing in mind, system 100 in FIG. 1 illustrates a network 102 that connects multiple electronic devices 110. Electronic devices 110 may include integrated circuits, such as a processor 111 and a network interface 112, which may be implemented using integrated circuits (ASICs) and/or field-programmable gate arrays (FPGAs) programmed to perform instructions and/or process data, as discussed herein. Electronic devices 110 may further include memory 113 to store instructions and/or data. Processor 111 and memory 113 may be used to perform operations over data exchanged with other electronic devices 110 over the network. Network interfaces 112 that may implement the protocols of the network. An example of one of the electronic devices 110 is illustrated in FIG. 2. As discussed above, the network interface 112 may also include circuitry that implements FEC schemes, such as FEC encoder 114 and/or FEC decoder 116. It should be noted that the processor 111 as well as the network interface 112, including the FEC encoder 114 and/or FEC decoder 116, may be implemented in ASICs, in soft intellectual property (IP) blocks programmed into programmable logic devices (PLDs) or FPGAs, or in a hardened universal processor programmed using instructions stored in a memory 113, or in some combination of these, or any other suitable circuitry.

Figure 3:
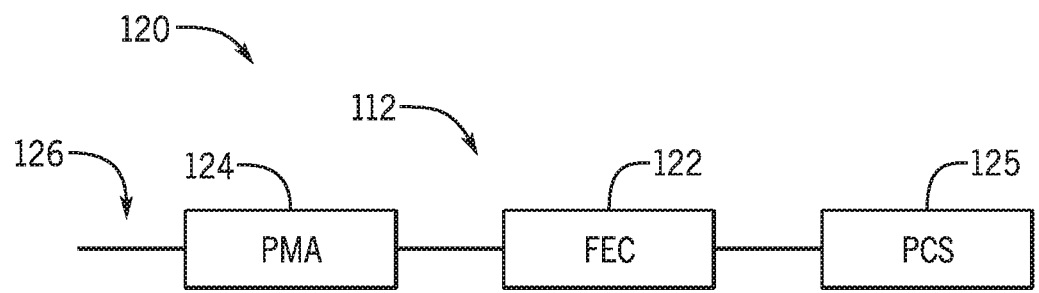
FIG. 3 is a schematic diagram of a network adaptor that may implement an FEC module, in accordance with an embodiment.

The diagram 120 in FIG. 3 provides a schematic view of the network interface 112. The network interface 112 may have FEC circuitry 122 which may include the FEC encoder 114 and/or decoder 116. The FEC encoder 114 may include parity circuitry that generates parity symbols or check symbols, cyclic-redundancy check (CRC) circuitry that generates CRC symbols, packet processing circuitry that processes packets (e.g., concatenating packets, separating packets, adding headers), and/or message generating circuitry that appends the generated parity symbols to the outgoing message to produce codewords. The FEC decoder 116 may include error-detection circuitry that identifies errors using the FEC encoding, corrects errors using the FEC encoding, detects data corruption using CRC symbols, packet processing circuitry that processes packets (e.g., concatenating packets, decomposing packets using boundaries, parsing headers), and/or message reconstruction circuitry, or block reconstruction circuitry, that concatenates decoded words of a decomposed message block, as detailed below. The FEC circuitry 122 may be coupled to a PMA layer 124, which may be coupled to the physical medium 126 of the network 102, and a PCS circuitry 125, which may be provided to the electronic device.

As discussed above, FEC circuitry may implement coding schemes such as BCH codes and Reed-Solomon codes in which the codewords may have variable length or variable number of check symbols. In an implementation, for example, FEC circuitry 122 may encode/decode blocks having 544 symbols, 272 symbols, 136 symbols, 68 symbols, 34 symbols, or 17 symbols. Moreover, an implementation of the FEC circuitry 122 may encode/decode blocks having 136 symbols, in which the number of check symbols may be 2, 4, 5, 6, or 8. For illustration, the present disclosure will discuss a system that may implement a Reed Solomon (544,514) codeword (i.e., a Reed Solomon code with blocks having 544 symbols and 30 check symbols), and which may be decomposed into Reed Solomon codes formats using blocks having 136 symbols, such as RS (136, 128), RS (136, 129), etc. It should be understood that these are non-limiting examples, and the teachings described herein may be applied to generate codes in other formats, or using other strategies, as is understood in the art.

When receiving data, the PMA layer 124 may receive a stream of serialized message blocks, which should be transmitted to the FEC circuitry 122. The timing diagram 130 in FIG. 4A illustrates a serialized received stream when the network protocol specifies FEC messages with 544 symbols in length. The 544 symbols of the message block 138 are mapped over 4 virtual channels 132A, 132B, 132C, and 132D. Each column 134 represents the data received at a particular time. Columns 134A-H represent the order of the data (e.g., data in column 134A is received prior to data in column 134B, etc.). The timing diagram 140 in FIG. 4B illustrates a serialized stream when the link may employ FEC blocks having 136 symbols. The two 136-symbol codewords 142A and 142B are mapped over the 4 virtual channels 132A, 132B, 132C, and 132D.

Figure 5:
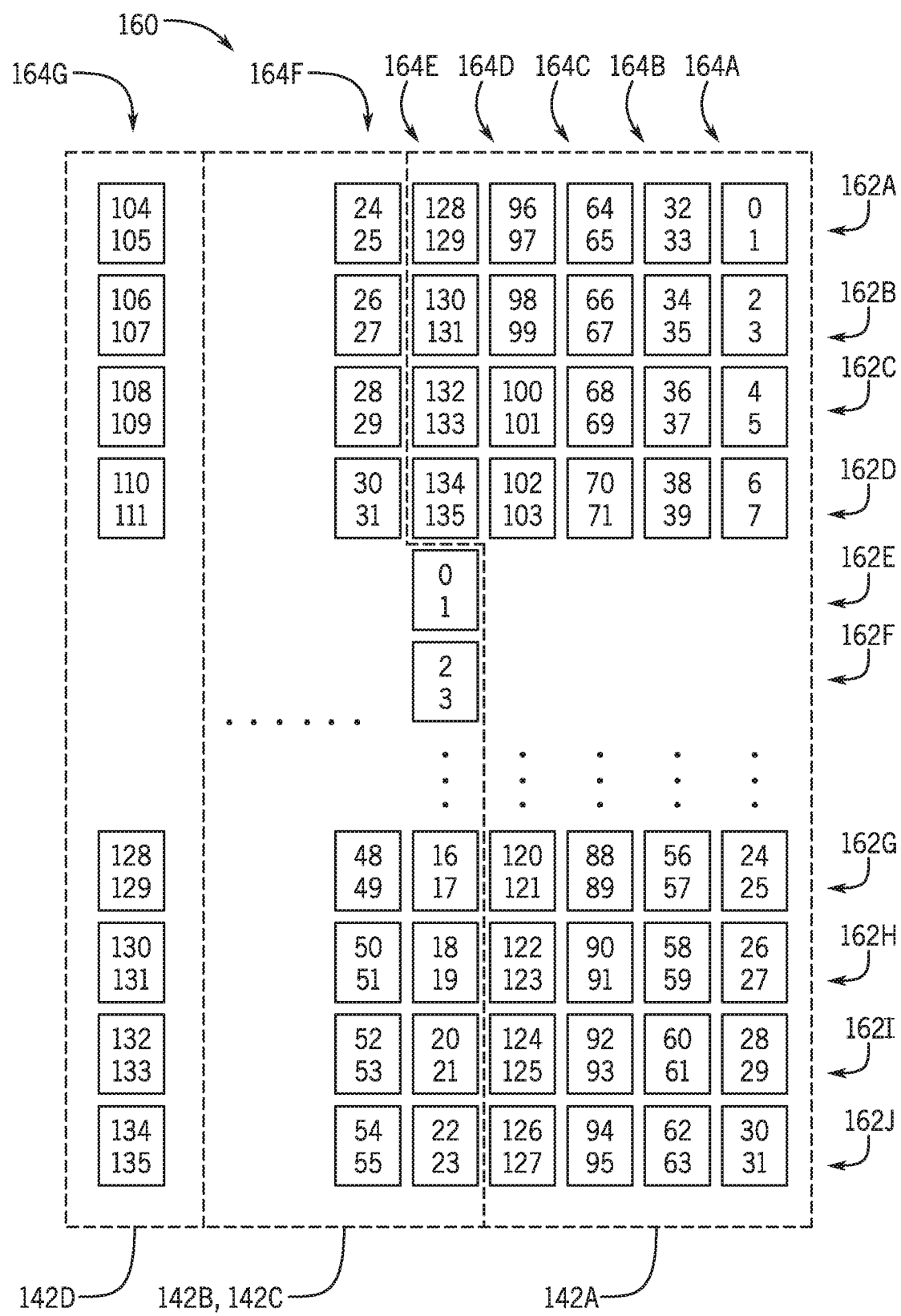
FIG. 5 is an example of a time chart of the data stream of FIG. 4B distributed over 16 2-symbol lanes, in accordance with an embodiment.

The PMA layer 124 may provide the data to the FEC circuitry 122 using an internal parallel interface, which may be used to process the packets. For example, timing diagram 160 in FIG. 5 illustrates an interface having 16 lanes 162A-J, and each lane may have two symbols. Columns 164A-Q represent the order of the data (e.g., data in column 164A is received prior to data in column 164B, etc.). The timing diagram 160 in FIG. 5 shows the mapping of the 136 symbols of the FEC codewords in the parallel interface. Since the interface provides 32 symbols per clock cycle, the 136 symbols of the message may not be aligned in frame with the PMA and/or the PCS interface. Note for example, that the first 136 symbols of the first codeword 142A are mapped in columns 164A, 164B, 164C, 164D, and the top 4 lanes (162A-D) of column 164E. The remainder of column 164E includes symbols from the second 136-bit codeword 142B. Note further that, in this example, the data may realign in frame with the PMA and/or the PCS interface after every 4th codeword (here, after codeword 142D).

Figure 6:
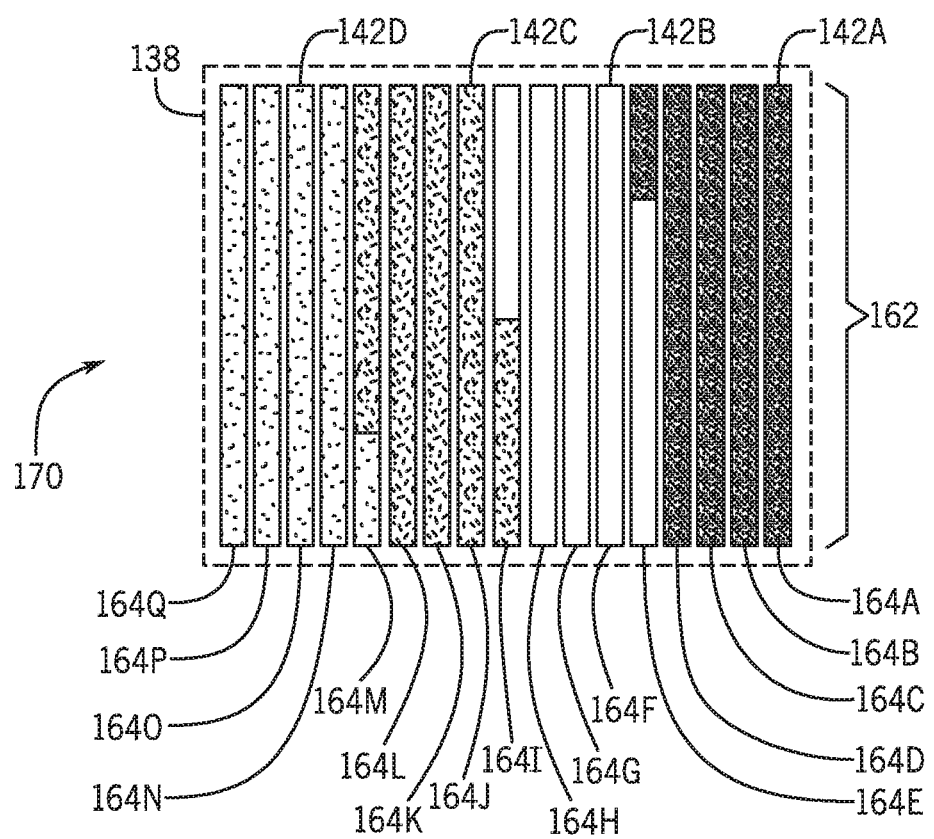
FIG. 6 is a schematic time chart of the data stream of FIG. 4B showing 4 codewords of 136 symbols distributed over 16 2-symbol lanes, in accordance with an embodiment.

Diagram 170 of FIG. 6 further illustrates this mapping, showing the 4 codewords 142A-D of 136 symbols over time, as well as the single codeword 138, with 544 symbols. Note that, while codewords 142A-D may use 4 cycles for re-alignment, a 544-symbol message block 138 is automatically aligned at every cycle. As such, the FEC circuitry 122 receiving the data over the 32-bit wide interface may adjust the boundaries of the messages (e.g., codewords) according to the specific decomposition. For example, when receiving codewords with 544 symbols, the FEC circuitry 122 may delimit message boundaries every 17 clock cycles, in line with the interface frame. By contrast, when receiving codewords with 136 symbols, the FEC circuitry 122 may delimit the boundary for the first codeword after 5 cycles, and the boundary for the second, third, and fourth codewords after 4 cycles.

While the above-described example discusses regularly sized word decompositions (e.g., evenly spaced decompositions), irregular decompositions of the large FEC block may also be used. The number of cycles may depend on the length of the codewords, as well as on the width and frequency of the implementation logic. For example, in an FPGA, the logic may run at a lower frequency and a wider data path, using few clocks per codeword. By contrast, in an ASIC, the logic may run at a higher frequency, which may allow a reduction in parallelism in the logic, but may use a higher number of clock cycles for processing. More general architectures that support irregular for the interface logic and the FEC data path, including architectures that may support any relationship between the number of symbols per cycle in the interface logic, the FEC data path, and codeword lengths, may be also be used.

Figure 7:
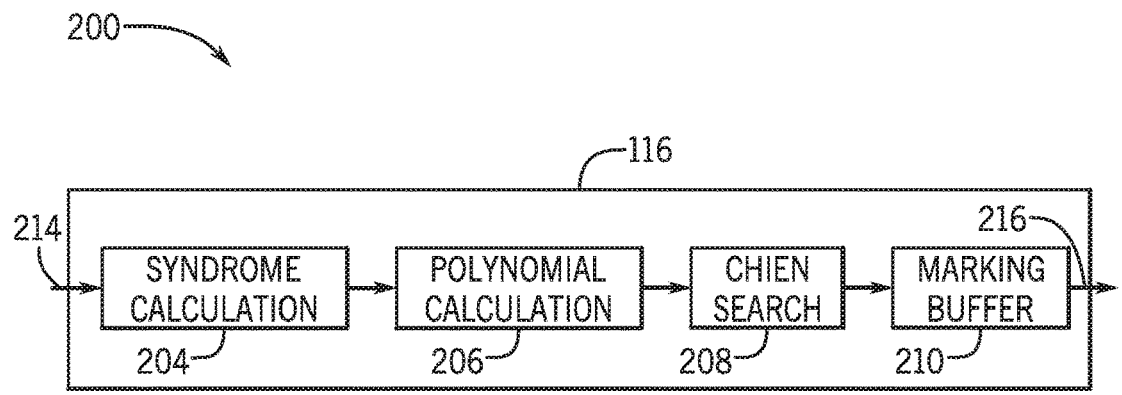
FIG. 7 is a schematic diagram of an FEC decoder that may decode messages having variable length FEC codewords, in accordance with an embodiment.

The diagram 200 of FIG. 7 illustrates a Reed Solomon (RS) decoder 202, which may be an implementation of the decoder 116 illustrated in FIG. 2. The RS decoder 202 may receive FEC codewords 214 from the PMA layer 124 and provide corrected codewords 216. The RS decoder 202 may include a syndrome calculation block 204, a polynomial calculation block 206, a Chien search block 208, and a marking buffer block 210. The syndrome calculation block 204 may identify the presence and the number of errors (e.g., number of corrupted symbols) in the received FEC codeword 214. If the number of errors identified is equal or higher than the correction power of the FEC code, the syndrome calculation block may mark the codeword as corrupted beyond possibility of repair. The polynomial calculation block 206 may be used to identify the error locations using an error-locating polynomial, which may be associated with the specified codeword format. The Chien search block 208 may be used to correct the errors in the corrupted data using any suitable form of data correction or recovery.

In this example, the RS decoder 202 may decode FEC codewords 214 that may have 544 symbols, in the long form, or 136 symbols, when decomposed. Each of the blocks 204, 206, and 208 may process codewords that are 136-symbols wide, in a pipelined manner. For example, once the syndrome calculation block 204 finalizes processing 136-symbols, it may provide the identified syndromes (e.g., remainder of a polynomial division) to the polynomial calculation block 206 and start processing the next 136-symbols. If the received FEC codewords 214 are short (e.g., codewords of 136 symbols), the output of the Chien search block 208 may be the corrected FEC codewords 216. If the received FEC codewords 216 are long (e.g., codewords of 544 symbols), the marking buffer block 210 may combine the outputs of the Chien search block 208 until the four portions of codeword are decoded, and reconstruct the full message.

Figure 8:
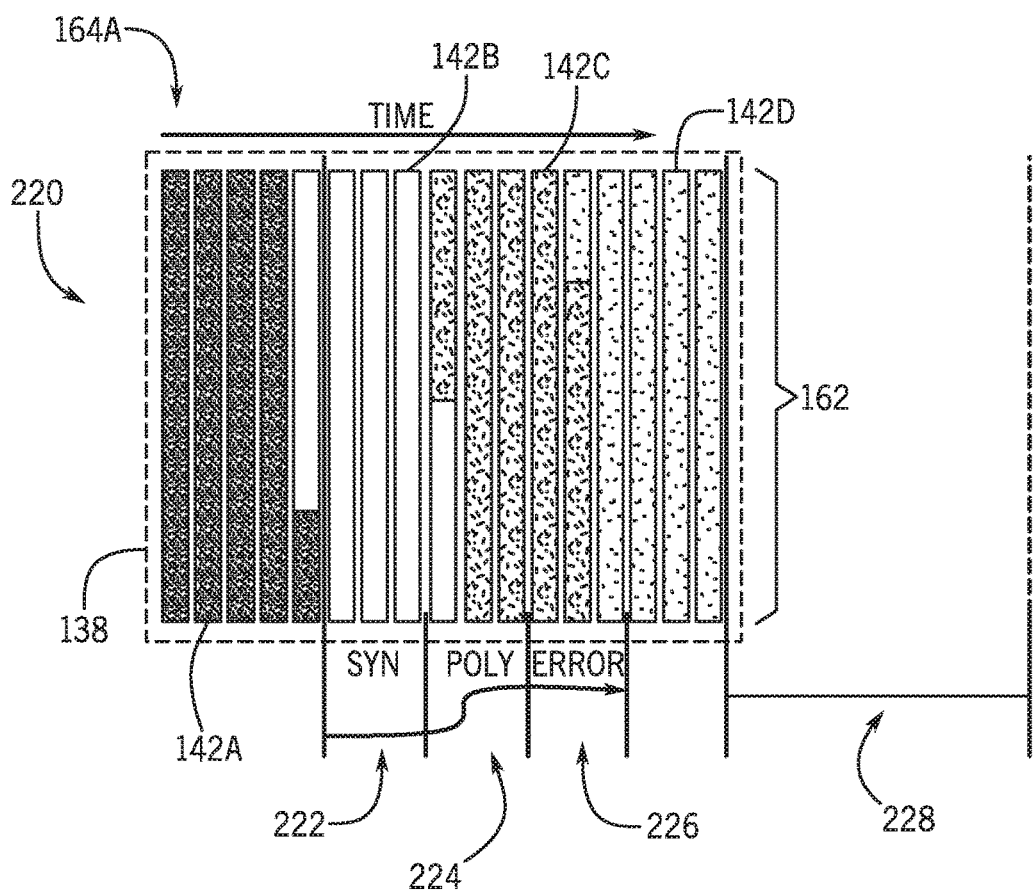
FIG. 8 is a schematic time chart illustrating the decoding latencies in an FEC decoder, in accordance with an embodiment.

The timing diagram 220 in FIG. 8 illustrates latencies that may be obtained by the pipelined processing for a long FEC codeword as well as for short decomposed FEC codewords. Note that the timing diagram of FIG. 8 is a reversed version of the timing diagram of FIG. 6. In this illustration, it is assumed that each block of the data path, including the syndrome calculation block 204, the polynomial calculation block 206, and the Chien search block 208, may take 3 clock cycles each to process the 136 symbols, as represented by time periods 222, 224, and 226 respectively. In the case of decomposed FEC codewords, the latency in obtaining the FEC codewords 216 may be 9 clocks from the end of receiving a code word. As discussed above, the first codeword 142A may take 5 clock cycles to be read into the decoder 202, while the codewords 142B-D may take 4 clock cycles to be read into the decoder. As a result, in some cases when using short codewords (e.g., short words), the latencies may be as small as 14 clock cycles for the first codeword 142A, and 13 clock cycles for the second codeword 142B, third codeword 142C, and fourth codeword 142D.

In the case of a long codeword that covers the entire message block 138, the RS decoder 202 may process the decomposed codewords separately. In this case, the marking buffer block 210 may be used to aggregate the errors and/or error corrections identified in the decomposed codewords to provide a long corrected codeword 216. As with the short codewords, the syndrome is calculated as the incoming decomposed words enter the syndrome calculation block 204. Following the syndrome calculation, the polynomial of a first decomposed word is calculated in the polynomial calculation block 206 while the second decomposed word is processed by the syndrome calculation block 204. Following the polynomial calculation, the error locations and correction values for the decomposed codewords may be generated in the Chien search block 208. The resulting marked decomposed words may be stored in the marking buffer block 210, which may hold until the last incoming decomposed codeword arrives. The marking buffer may combine the decomposed codewords to generate the marked long corrected codeword 216. The entire group of codewords may be marked together by using an OR logic block of the marking of the decomposed codewords.

In the above example, the total latency may be a combination of the 17 cycles to read in the codeword (e.g., the entire message block 138), the 9 cycles to process the last received decomposed codeword, and the latency of the marking buffer block 210. It should be noted that this latency may be generally be smaller than the latency of a Reed Solomon decoder that may process a single long word in a non-decomposed manner, as the RS decoder 202 operates with shorter polynomials. RS decoder 116 may also reduce the latency of processing by bypassing the combination of the decomposed codewords in the marking buffer block 210. RS decoder 116 may employ a cyclic redundancy check (CRC) algorithm to evaluate the group of decomposed words.

Note that, when processing a long codeword (e.g., a codeword that may have more symbols than the number of pipeline symbols available), the decomposition into shorter words may be irregular. An asymmetric (i.e., irregular) decomposition may be used in such situation. The asymmetry may be in the number of symbols in each decomposed codeword. The asymmetry may also be in the number of check symbols per codeword. The number of check symbols per decomposed codeword may be adjusted based on the correction power of the resulting codewords. This asymmetric decomposition may be due to the lengths of the original codeword. For example, an RS (544,514) codeword may not be decomposed in 4 identical decomposed codewords with a symmetric number of check symbols.

An asymmetric decomposition may also be used to improve the correction performance. For example, an RS (544,514) codeword may be decomposed into two decomposed RS (272,257) codewords, each decomposed codeword having 15 check symbols, which may correct up to 7 symbol errors. The power of this encoding may be similar to one in which 14 check symbols are used, and thus, the check symbols can be asymmetrically distributed between the codewords without loss of correction power by the encoding. For example, the first codeword could have 16 check symbols (correcting up to 8 errors) and the second codeword could then have 14 check symbols (correcting up to 7 errors). The 15 check symbols may also be used to increase the code distance for increased robustness of uncorrectable codeword detection. In certain situations, the communication link may employ a codeword decomposition with a variable block length having a fixed number of message symbols and a variable number of check symbols. The decoder, in such situation, may decode codewords that are longer than the block length of the short decoder. This type of strategy for decoding may take place by employing the supported number of check symbols and discarding the excess check symbols.

The power of the decomposed FEC codewords may be affected by the decomposition. As an example, if an RS (544,514) codeword is decomposed into four FEC blocks with alternating short RS (136,129) and RS (136,128) codewords, the correction power is reduced. The short codewords may have 7 or 8 check symbols, while the long codeword may have 30 check symbols. As such, the distance between two codewords in RS (136, 129) or RS (136, 128) may be much smaller than the distance between two codewords in RS (544, 514). In some situations, the number of check symbols may be further reduced, and a cyclic-redundancy check (CRC) code may be added. For example, the decomposition of RS (136, 128) may be encoded as having 128 message symbols, 6 Reed-Solomon check symbols and 2 CRC symbols. The loss of correction power due to the reduction in check symbols may be compensated by the increase in the error detection power due to the addition of the CRC symbols. When employing such strategy, the decoder may include a CRC verification block, which may be used to mark errors in a short codeword, in combination with the Reed Solomon decoder.

Figure 9:
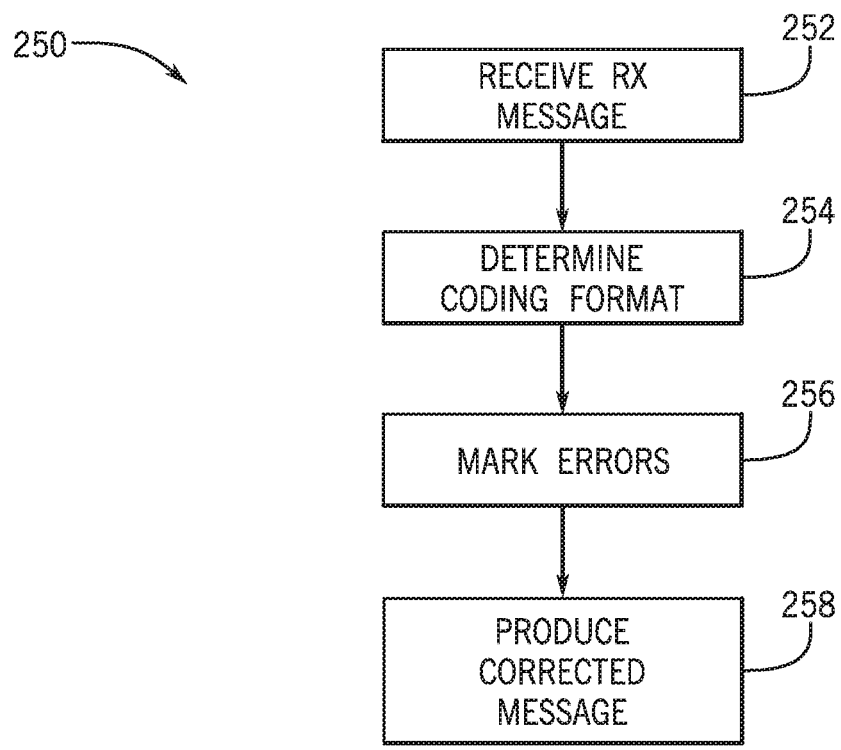
FIG. 9 is a flow chart of a method for error marking and/or correction of received messages having variable length FEC codewords, in accordance with an embodiment.

A flowchart 250 of FIG. 9 illustrates a general method to operate a decoder that may receive variable length decomposed codewords, such as decoder 116. The method may involve receiving codewords at block 252. The decoder 116 may determine the coding format (e.g., codeword length, number of check symbols, decomposition configuration, presence of CRC symbols, etc.) at block 254. This determination may be made during a connection negotiation process, by the identification of headers, or based on a communication protocol. As discussed above, the decoder may process words that have a length that is larger than the length of the pipeline, and the decoder may decompose the incoming codeword. From the coding format and the decomposition employed, the decoder may mark and/or correct errors in the decomposed words at block 256. As the corrected decomposed codewords may then be combined to produce a corrected message at block 258.

Figure 10:
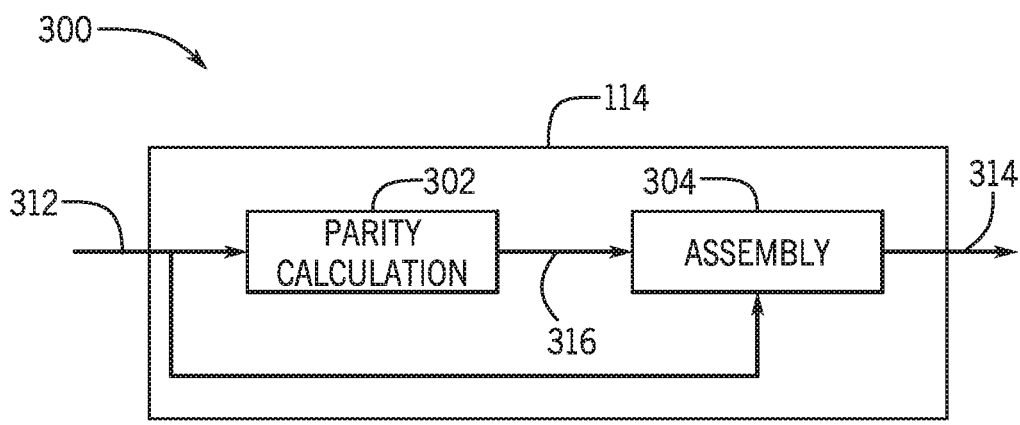
FIG. 10 is a schematic diagram of an FEC encoder that may be used to generate variable-length FEC codewords, in accordance with an embodiment.

In some embodiments, encoding circuitry that may generate codewords in a decomposable FEC format such as the ones described above may be used. A block diagram 300 in FIG. 10 illustrates an encoder 114 that may receive a message 312 and produce an FEC-encoded message 314. Encoder 114 may have a parity calculation block 302 that receives a message 312 and may generate the check symbols 316. The produced check symbols 316 may be appended to the message 312 to produce the FEC-encoded message 314. In some embodiments, the encoder 144 may include multiple instances of the parity calculation block 302 (e.g., multiple instantiations in an FPGA) wherein each instance is programmed to calculate the check symbols for each format.

In some embodiments, a single encoder instance may be used to create codewords in multiple FEC formats. In situations such as when an encoder 114 supports two codeword lengths differing by few check symbols, one parity calculation block 302 may be used to generate check symbols for both codeword formats, as detailed below. While the example discussed herein relates to Reed-Solomon encoders, more general BCH codewords may be generated in a similar manner. Note further that in the following discussion, several of the mathematical elements and operations may be defined with respect to algebras over finite fields, such as Galois fields. As such, certain operations described below, such as addition, multiplication, and division, may refer to the operator within the field, as known in the art (e.g., summations in a Galois Field may not include a carry-over, multiplication in a Galois field may be a multiplication followed by a modulo operation with an irreducible characteristic polynomial associated with the field, etc.).

In general, a Reed Solomon code may be generated by circuitry that generates a parity vector $p=[p_{c-1}, p_{c-2}, \ldots, p_0]$ from a message $m=[m_{k-1}, m_{k-2}, \ldots, m_0]$ to produce an FEC block with length $n=c+k$, such that the vectors solve an equation:

$$mS_u + pS_d = 0. \quad (1)$$

Letting the $\alpha$ be the characteristic value of the Galois field, the roots of the characteristic polynomial may be $\alpha, \alpha^2, \alpha^3, \ldots$, and the matrices $S_u$ and $S_d$ may be written as:

$$S_u = \begin{bmatrix} \alpha^{c(n-1)} & \cdots & \alpha^{n-1}, 1 \\ \vdots & \ddots & \vdots \\ \alpha^{(c-1)(n-k)} & \cdots & \alpha^{n-k}, 1 \end{bmatrix}, \text{ and} \quad (2)$$

$$S_d = \begin{bmatrix} \alpha^{(c-1)^2} & \cdots & \alpha^{c-1}, 1 \\ \vdots & \ddots & \vdots \\ 1 & \cdots & 1, 1 \end{bmatrix}. \quad (3)$$

As such, an encoder may be a circuit and/or a system that implements a solution to the inverse problem described above. The resultant vector $mS_u$ may be calculated efficiently by performing a syndrome calculation (i.e., a polynomial division) on the message m after padding the message with null symbols (e.g., 0 symbols) in place of the parity symbols. The resultant vector $mS_u$ may also be calculated by partially performing the syndrome calculation, halting the syndrome calculation after the last symbol in message m, and frequency shifting the partially computed syndromes to their final positions using constants. It should be noted that the resultant vector, shown below, may be the elements of the first column of $S_d$:

$$mS_u = \{\alpha^{(c-1)(c-1)}, \alpha^{(c-2)(c-1)}, \ldots, \alpha^{(c-1)}, 1\}. \quad (4)$$

Let the final (n–k) calculated values as the partial syndromes, which we will define as $SYP=mS_u$. It may be possible to solve for p by performing the matrix division:

$$p = \frac{SYP}{S_d}. \quad (5)$$

This equation may be performed to obtain p in a two-step process. By inspection, $S_d$ may be a Vandermonde matrix, and thus may be decomposed as $S_d = L_d U_d$. Following the decomposition, p may be calculated by first calculating the forward vector $F=SYP/L_d$, and then calculating $p=F/U_d$. Due to the simplicity of the matrices in the decomposition, circuitry that implements the two-step process to solve the inverse problem may be more efficient.

Figure 11A:
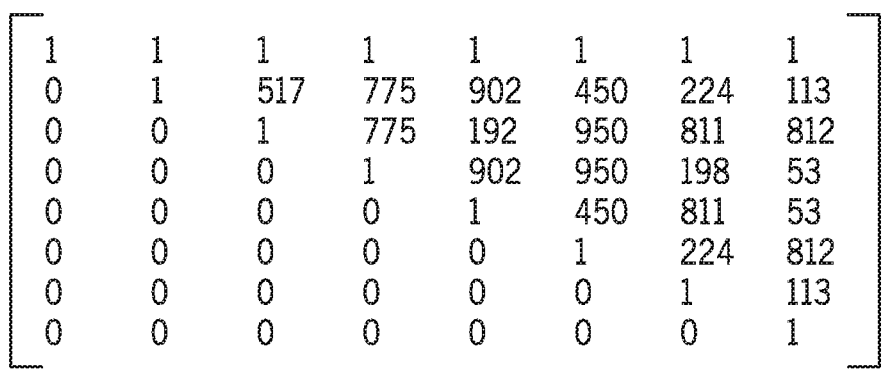
FIG. 11A is an upper matrix of a decomposition of an error checking matrix that may be associated with a Reed-Solomon code in an RS (136,128) format, in accordance with an embodiment.
Figure 11B:
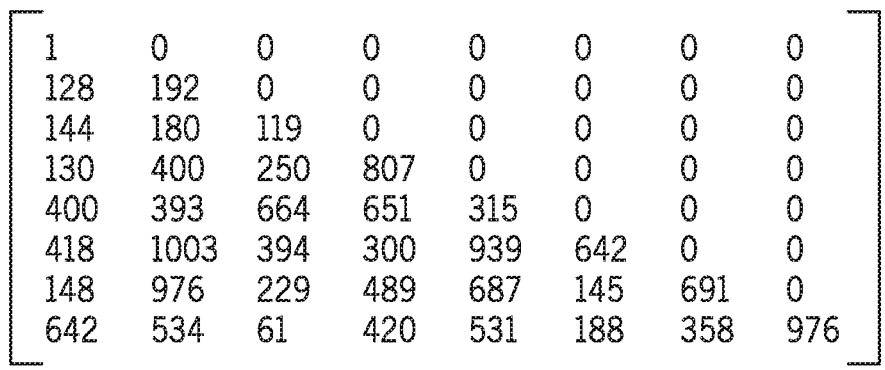
FIG. 11B is a lower matrix of a decomposition of an error checking matrix that may be associated with a Reed-Solomon code in an RS (136,128) format, in accordance with an embodiment.
Figure 12A:
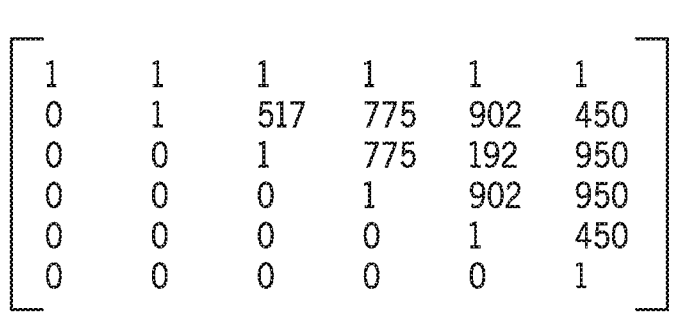
FIG. 12A is an upper matrix of a decomposition of an error checking matrix that may be associated with a Reed-Solomon code in an RS (136,130) format, in accordance with an embodiment.
Figure 12B:
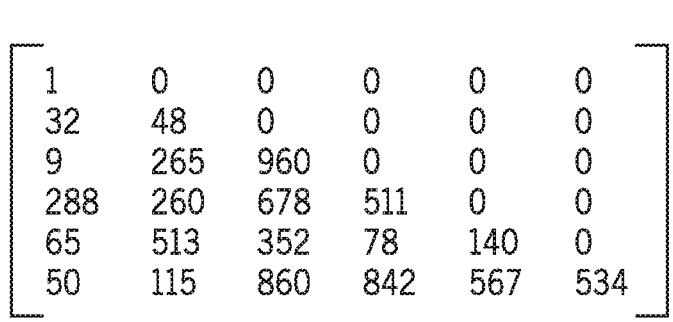
FIG. 12B is a lower matrix of a decomposition of an error checking matrix that may be associated with a Reed-Solomon code in an RS (136,130) format, in accordance with an embodiment.

As discussed above, in some implementations a single encoder circuitry may be used to generate codewords in multiple formats having small differences in the number of check symbols. To illustrate that, we will consider an example of an encoder that may create check symbols for Reed-Solomon encoded FEC messages having blocks of 136 symbols. The FIGS. 11-14 illustrate the relationship between Reed-Solomon formats with variation in the number of check symbols. FIGS. 11A and 11B illustrate the $U_d$ 402 and the $L_d$ 404 that may be used in the generation of codewords in an RS (136, 128) format (e.g., 8 check symbols), respectively. FIGS. 12A and 12B illustrate the $U_d$ 406 and the $L_d$ 408 that may be used in the generation of codewords in an RS (136, 130) format (e.g., 6 check symbols), respectively. FIGS. 13A and 13B illustrate the $U_d$ 410 and $L_d$ 412 that may be used in the generation of codewords in an RS (136, 131) format (e.g., 5 check symbols). FIGS. 14A and 14B illustrated the $U_d$ 414 and $L_d$ 416 that may be used in the generation of codewords in an RS (136, 132) format (e.g., 4 check symbols).

The above-illustrated pairs of matrices may be used to implement multiple encoders. In some embodiments, a single encoder with programmable coefficients may be used. In such situation, the coefficients associated with each pair of matrices may be stored in a memory, and may be loaded upon determination of the encoding format. It should be noted that the relationship between the matrices may be used to implement multiple encoders with shared hardware. As an example, consider the upper matrices $U_d$ 402, 406, 410, and 414 mentioned above. It should be noted that the top left section of the matrices $U_d$ are common across the different code formats, as illustrated in FIG. 15. As a result, a single encoder may be used to solve for the expression $p=F/U_d$, as discussed below with respect to FIG. 17B. More generally, multiple encoding formats having a similar block length and a variable number of check symbols may present this relationship between the upper matrices of the decomposition of the FEC encoder matrix described above.

Similarly, due to certain similarities in the structure of lower matrices of the decomposition of the FEC encoder matrix associated with different formats and fixed block length, a single encoder circuit may implement multiple FEC codes. For example, the rows of the lower matrices $L_d$ 404, 408, 412, and 416, may be related by a power of the root of the polynomial $\alpha$. The diagram in FIG. 16 illustrates, as an example, the relationship between the rows of the lower matrix $L_d$ 416, which may be associated with the RS(136,132) format and the lower matrix $L_d$ 412, which may be associated with the RS (136, 131) format.

Figure 16:
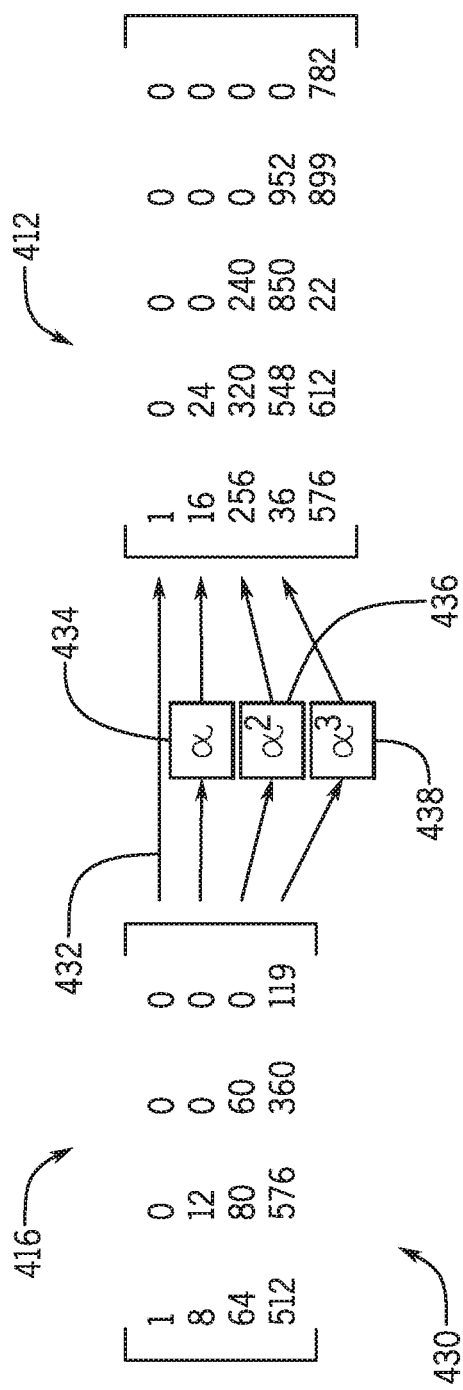
FIG. 16 is a diagram that illustrates a relationship between two lower matrices that may result from the decomposition of error checking matrices associated with Reed-Solomon codes with fixed codeword length and different number of check symbols, in accordance with an embodiment.

In the example illustrated in FIG. 16, it should be noted that the first row of $L_d$ 416 is similar to the first row of $L_d$ 412 (arrow 432), the second row of the $L_d$ 416, when multiplied by a the fundamental root (e.g., a illustrated in arrow 434) becomes similar to the second row of $L_d$ 412, the third row of the $L_d$ 416, when multiplied by the square of the fundamental root (e.g., $\alpha^2$ illustrated in arrow 436) becomes similar to the third row of $L_d$ 412, and the fourth row of the $L_d$ 416, when multiplied by the square of the fundamental root (e.g., $\alpha^3$ illustrated in arrow 438). Note that, as the dimensions of the matrices for different codes are different, truncations and/or padding values may be used.

More generally, for Reed-Solomon codewords with a fixed number of symbols, the lower matrix of a decomposition may be determined by adjusting the lower matrix $L_d$, when adding one additional check symbol, multiplying the coefficients of the second row of the matrix by a, multiplying the coefficients of the third row of the matrix by $\alpha^2$, multiplying the coefficients of the fourth row of the matrix by $\alpha^3$, multiplying the coefficients of the fifth row of the matrix by $\alpha^4$, ..., multiplying the n-th row of the matrix by $\alpha^{n-1}$ in the lower matrix decomposition of the smaller matrix. It should be noted that if the number of check symbols increase by 2, two iterations of the process may be applied, such that the second, third, and fourth rows are multiplied by $\alpha^2$, $\alpha^4$, and $\alpha^6$, respectively. Similarly, if the number of check symbols increase by four, the second, third, and fourth rows are multiplied by $\alpha^4$, $\alpha^8$, and $\alpha^{12}$, respectively.

Figure 17A:
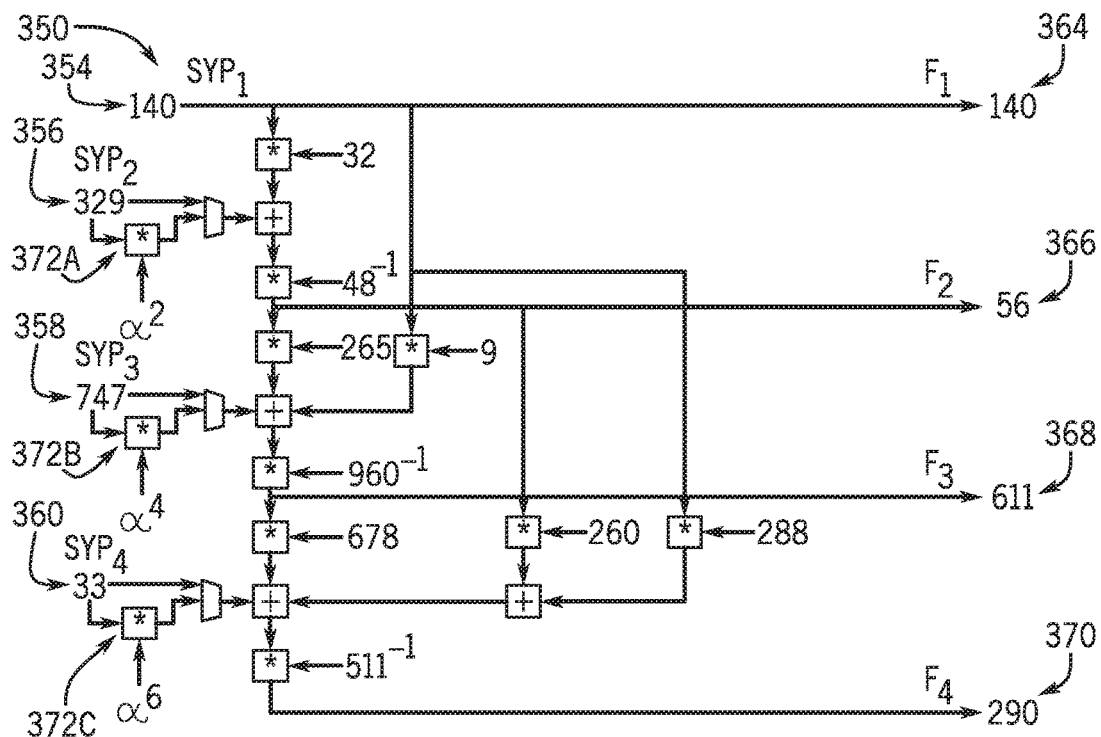
FIG. 17A is a schematic diagram of an example of a forward substitution stage of a parity block to create codewords using a variable number of check symbols, in accordance with an embodiment.
Figure 17B:
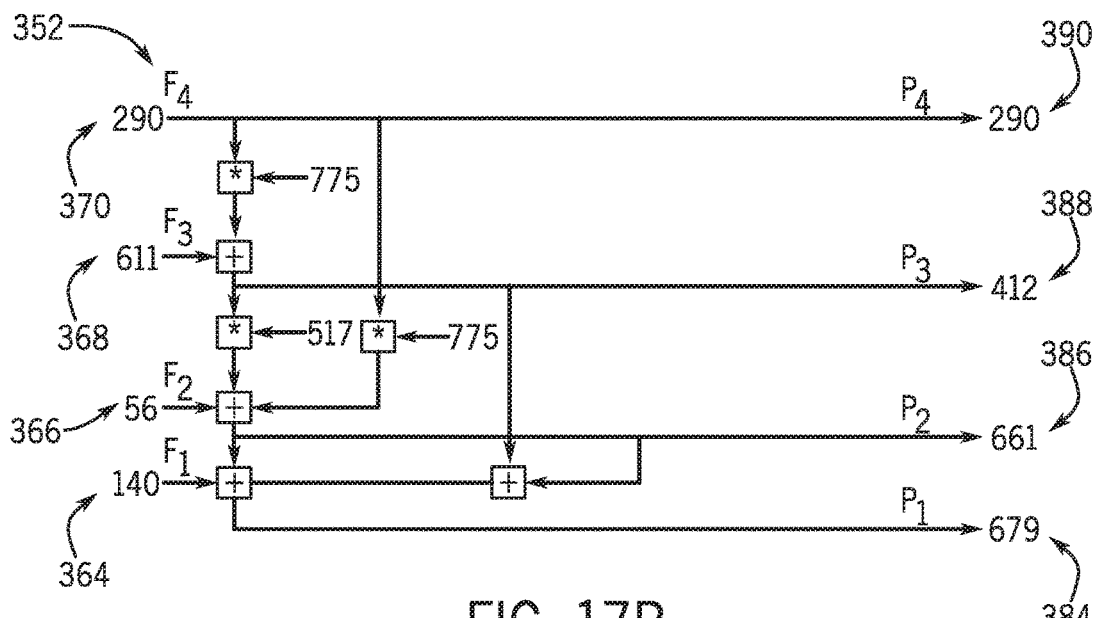
FIG. 17B is a schematic diagram of an example of a backward substitution stage of a parity generation block to FIG. 18 is a flow chart of a method to generate codewords using variable-length FEC formats, in accordance with an embodiment.

As discussed above, in certain situations, such as when the message block has a fixed number of symbols and the number of check symbols vary, a single encoder may be used to produce message blocks in the multiple formats, in view of the similarities between encoding matrices discussed above. More generally, matrix coefficients may depend on the number of check symbols and the Galois Field associated with the message. The circuits 350 and 352 illustrated in FIGS. 17A and 17B illustrate a portion of the parity calculation block 302 that may be used to produce parity symbols for a Reed Solomon blocks having 4 or 6 check symbols from partial syndrome values of the message. The circuits may employ the forward substitution and the backwards substitution process discussed above, using $L_d$ and $U_d$ matrices. In the illustrated example of FIGS. 17A and 17B, the first process is performed by the forward substitution circuit 350 and may provide the forward vector from the partial syndromes vector using the lower matrix of the decomposition. The second process is performed by the backward substitution circuit 352 and may calculate the parity symbols from the forward vector using the upper matrix of the decomposition. As the lower and the upper matrices are triangular matrices, circuits 350 and 352 may provide a highly efficient implementation to calculate parity symbols.

A forward substitution circuit 350 illustrated in FIG. 17A may be used to perform the forward substitution step to calculate the forward vector using the coefficients of the lower matrix $L_d$. In the example illustrated, the forward substitution circuit 350 may be used to calculate up to four check symbols in the RS (136, 130) and RS (136, 132) formats, using coefficients from the matrices 408 and 416. The forward substitution circuit 350 may receive partial syndrome values 354, 356, 358, and 360, and may produce four forward values 364, 366, 368, and 370. The forward substitution circuit 350 may be adjusted to provide symbols in either the RS (136,130) or the RS (136,132) by adjustment of configurable multipliers 372A, 372B, 372C, and 372D, as detailed below.

To solve for the forward values 364, 366, 368, and 370 for the RS (136, 130), the circuit 350 may solve the triangular linear system using the partial syndrome values 354, 356, 358, and 360 and the triangular matrix $L_d$ 408. Thus, in this example, the forward values may be solved using the following expressions:

$$\begin{cases} F_1 = SYP_1/1 \\ F_2 = (SYP_2 - 32*F_1)/48 \\ F_3 = (SYP_3 - 9*F_1 - 265*F_2)/960 \\ F_4 = (SYP_4 - 288*F_1 - 260*F_2 - 678*F_3)/511 \\ F_5 = (SYP_5 - 65*F_1 - 513*F_2 - 352*F_3 - 78*F_4)/140 \\ F_6 = (SYP_6 - 50*F_1 - 115*F_2 - 860*F_3 - 842*F_4 - 567*F_5)/534 \end{cases} \quad (6)$$

The circuit 350 illustrates the evaluation of the first four forward values. Accordingly, the first forward value 364 is the same as the first partial syndrome value 354, the second forward value 366 is the calculated using the first forward value 364 and the second partial syndrome value 356, etc. according to the coefficients and as illustrated in the example diagram. Note that the circuit for evaluation of the fifth and the sixth coefficient, not illustrated in the diagram, may be implemented using the above-described expressions. In the RS (136, 132) format, the triangular linear system becomes different. To solve for the forward values 364, 366, 368, and 370 for the RS (136, 132) the circuit 350 may solve the triangular linear system using the partial syndrome values 354, 356, 358, and 360 and the triangular matrix $L_d$ 416. However, as discussed above, the matrix $L_d$ 408 and the matrix $L_d$ 416 may be related by multiplying the second row by $\alpha^2$, the third row by $\alpha^4$, and the fourth row by $\alpha^6$. Thus, in the example, the system to be solved becomes:

$$\begin{cases} SYP_1 = 1*F_1 \\ SYP_2 = 8*F_1 + 12*F_2 \\ SYP_3 = 64*F_1 + 80*F_2 + 60*F_3 \\ SYP_4 = 512*F_1 + 576*F_2 + 360*F_3 + 119*F_4, \text{ or} \end{cases} \quad (7)$$

$$\begin{cases} SYP_1 = 1*F_1 \\ \alpha^2*SYP_2 = 32*F_1 + 48*F_2 \\ \alpha^4*SYP_3 = 9*F_1 + 265*F_2 + 960*F_3 \\ \alpha^6*SYP_4 = 288*F_1 + 260*F_2 + 678*F_3 + 511*F_4. \end{cases} \quad (8)$$

Note that the second inverse problem is similar to the first problem if the partial syndromes are multiplied by powers of the fundamental root $\alpha$. As a result, the system may be written as:

$$\begin{cases} F_1 = SYP_1/1 \\ F_2 = (\alpha^2*SYP_2 - 32*F_1)/48 \\ F_3 = (\alpha^4 SYP_3 - 9*F_1 - 265*F_2)/960 \\ F_4 = (\alpha^6 SYP_4 - 288*F_1 - 260*F_2 - 678*F_3)/511 \end{cases} \quad (9)$$

This system may be implemented in the forward calculating circuit 350 using configurable multipliers 372A, 372B, and 372C, which may adjust the coefficient used to multiply the partial syndromes 356, 358, and 360 by $\alpha^2$, $\alpha^4$, and $\alpha^6$, respectively. Configurable multipliers 372A-C may be configured by use of switches that bypass a fixed multiplier, by loading the coefficients from a memory attached in the encoder, and/or through a configurable look-up table that stores the potential values for the encoder. The forward substitution circuit 350 may calculate the forward vector for RS (136, 132) and RS (136, 130). Such strategy may be generalized to allow further changes in the number of check symbols, by changing the configurable multipliers 372A-C using rules such as those discussed above with respect to FIG. 16.

A backward substitution circuit 352 illustrated in FIG. 17B may be used to calculate parity symbols 384, 386, 388, and 390 from the forward values 364, 366, 368, and 370 for RS (136, 132) and RS (136, 130). As illustrated in FIG. 15, discussed above, the coefficients for the upper matrix of the decomposition may be substantially the same. As an example, the RS (136, 132) format 414 includes the upper right 4×4 part of the decomposed upper matrix for the RS (136, 130) format 406. As such, the portion of the backward substitution circuit 352 that may be used to calculate the first four parity symbols for the RS (136, 130) format may be used to calculate the parity symbols in the RS (136, 132)

without any modification. It should be noted that, when determining the parity symbols in the RS (136, 130) format, the fifth and the sixth parity symbols may be calculated, and these values may be used in the calculation of the first four symbols, as the matrix is an upper triangular matrix.

Figure 18:
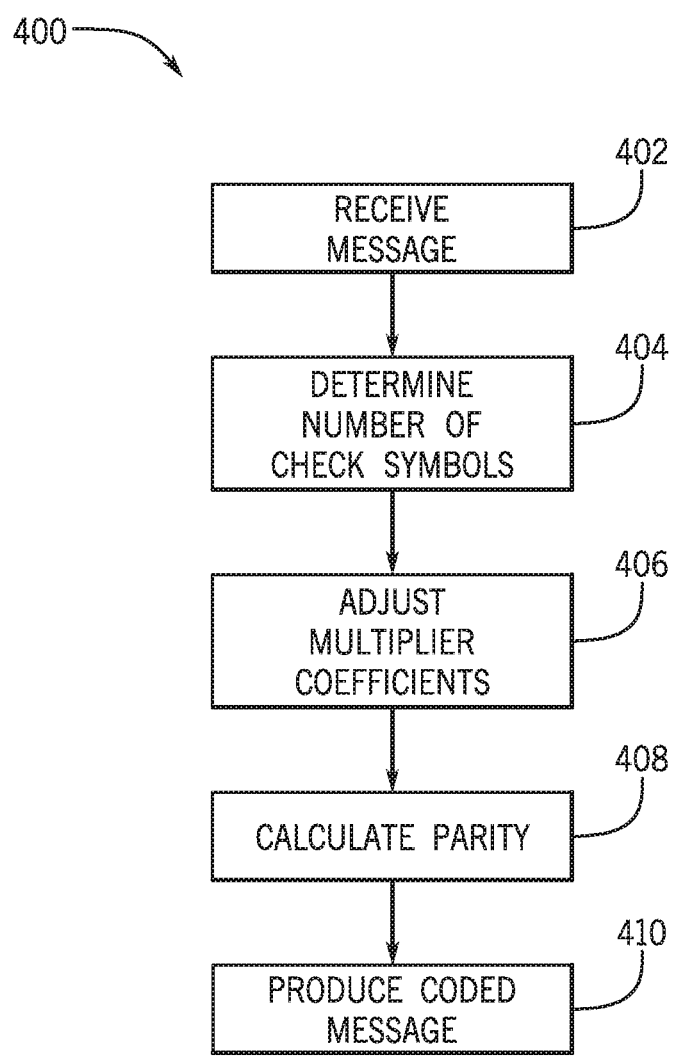

A flow chart 400 in FIG. 18 illustrates a method that may be used to encode systems with a variable number of check symbols, such as the encoders described above. In a first process, the encoder may receive an outgoing message (block 402). Based on a configuration of the encoder, which may be determined from a header of the message, the encoder may determine the number of check symbols and/or parity symbols to be added to the message (block 404). The format of the message block may be determined (e.g., number of symbols in the block, number of check symbols in the block) based on this determination. The encoder may adjust a parity-generating block by loading coefficients from a memory (block 406). In some embodiments, all the coefficients may be reconfigured based on the format. In other embodiments, such as the ones illustrated in FIGS. 17A and 17B, certain multipliers may change the number of check symbols used in the messages. A switch may be used to configure the multipliers, as discussed above. The configured parity-generating block may be used to calculate the parity symbols (block 408) by processing the message. The generated parity symbols may be attached to the original message to produce an outgoing encoded message, which may be transmitted to the network (block 410).

The encoders and decoders described in this application may be used to provide flexibility in the number of check symbols and/or block lengths used in error correction coding schemes, such as FEC schemes used in Ethernet networks. Network systems employing the encoder and decoders described herein may be used to provide low latency communications in highly reliable network environments, such as backplane Ethernet in a datacenter, while preserving backward compatibility of the network interface.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

EMBODIMENTS OF THE CURRENT APPLICATION

Clause A1. A forward error correction (FEC) decoder configured to decode codewords of variable length, comprising:
  packet processing circuitry configured to decompose a received message block into a plurality of short codewords, wherein each of the short codewords is shorter than the codeword;
  error-detection circuitry configured to:
    verify, for each short codeword of the plurality of short codewords, an integrity of the respective short codeword; and
    produce, for each short codeword, a respective decoding message of a plurality of decoding messages based on the integrity of the respective short codeword, wherein the respective decoding message comprises a number of errors in the respective short word, a correction of the respective short word, or a corruption mark of the short codeword, or any combination thereof; and
  block reconstruction circuitry configured to modify the received message block to produce a marked message block based on the plurality of decoding messages, wherein the marked message block comprises the received message block, a correction of the message block, a number of errors of the message block, or a message block corruption mark, or any combination thereof.

Clause A2. The FEC decoder of clause A1, wherein the codeword comprises an Ethernet message.

Clause A3. The FEC decoder of any of claims A1 or A2, wherein the block reconstruction circuitry is configured to combine the short words to provide the decoded word, wherein a length of the decoded word is the same as the length of an original codeword.

Clause A4. The FEC decoder of any of clauses A1-A3, wherein the packet processing circuitry is configured to decompose the message block in regularly sized short codewords.

Clause A5. The FEC decoder of any of clauses A1-A4, wherein a number of check symbols in the plurality of short codewords differ.

Clause A6. The FEC decoder of any of clauses A1-A5, wherein, for each decomposition of the message block into the plurality of short codewords, a number of check symbols in the plurality of codewords differ.

Clause A7. The FEC decoder of any of clauses A1-A6, wherein the error-detection circuitry is configured to determine a number of symbols in each short codeword and to determine a number of check symbols in each short codeword.

Clause A8. The FEC decoder of any of clauses A1-A7, wherein the FEC decoder is configured to decode an FEC code that comprises a Reed-Solomon code, and wherein producing the respective short word associated with each short codeword comprises comparing a number of error locations with a length of an error-locating polynomial associated with the short codeword.

Clause A9. The FEC decoder of any of clauses A1-A8, wherein at least one short codeword of the plurality of short words comprises a cyclic-redundancy check (CRC) symbol, and wherein the error-detection circuitry is configured to calculate a CRC value for each short word.

Clause B1. A method to verify errors in a message block comprising a plurality of FEC codewords with variable length, comprising:
  separating each FEC codeword in the message block;
  for each FEC codeword, determining a respective block length and a respective number of check symbols;
  for each FEC codeword, determining a respective number of errors;
  for each FEC codeword, producing a respective short word of a plurality of short words, wherein each respective short word comprises the respective FEC codeword, a correction of the respective FEC codeword, or a corruption mark, or any combination thereof; and
  generating a corrected message block based at least in part on the plurality of short words, wherein the corrected message block comprises the message block, a correction of the message block, or a corruption mark, or any combination thereof.

Clause B2. The method of clause B1, wherein generating the corrected message block comprises concatenating the plurality of short words.

Clause B3. The method of any of clauses B1 or B2, wherein determining the respective block length and the respective number of check symbols for each FEC codeword comprises retrieving a header of the respective FEC codeword, a header of the message block, or a combination thereof.

Clause B4. The method of any of clauses B1-B3, the FEC codewords comprise a Reed-Solomon encoding, and wherein determining the respective number of errors for each FEC codeword comprises calculating a list of syndromes from the respective FEC codeword.

Clause B5. The method of any of clauses B1-B4, wherein each FEC codeword of the plurality of FEC codewords comprises a cyclic-redundancy check (CRC) symbol, and the method comprises:

for each FEC codeword, determining a respective CRC value; and for each FEC codeword, comparing the respective CRC value with the respective CRC symbol;

wherein producing the respective short word for each FEC codeword comprises adding a corruption mark to the respective short word based on a difference between the respective CRC value and the respective CRC symbol.

Clause B6. The method of any of clauses B1-B5, wherein the plurality of codewords consists of one codeword that comprises 544 symbols, and wherein each symbol comprises 10 bits.

Clause B6. The method of clause B5, wherein the plurality of codewords consists of two codewords comprising 272 symbols, and each codeword comprises 15 check symbols.

Clause B7. The method of any of clauses B5 or B6, wherein the plurality of codewords consists of four codewords comprising 136 symbols, and wherein each codeword comprises 4, 5, 6, 7, 8, or 9 check symbols.

Clause C1. A system comprising:

a network comprising a protocol that comprises a forward error correction (FEC) specification, wherein the FEC specification comprises a first codeword length;

a first electronic device coupled to the network, comprising an FEC encoder configured to produce a message block having the first codeword length, wherein the message block comprises a plurality of codewords of a smaller length; and a second electronic device coupled to the network, comprising an FEC decoder configured to receive the message block from the first electronic device, wherein the FEC decoder of the second electronic device comprises:

packet processing circuitry configured to receive the message block and separate the plurality of codewords;

error-detection circuitry configured to produce a respective decoded word of a plurality of decoded words for each codeword based on the FEC code; and message reconstruction circuitry configured to produce a decoded message block by merging the plurality of decoded words.

Clause C2. The system of clause C1, wherein the FEC encoder is configured to add a cyclic-redundancy check (CRC) symbol to the message block, and wherein the FEC decoder is configured to verify an integrity of the message block using the CRC symbol.

Clause C3. The system of any of clauses C1 or C2, wherein the first electronic device and the second electronic device each comprises, respectively, handshake circuitry, wherein each respective handshake circuitry is configured to determine a number of codewords in each message block, a length of the codewords in each message block, and a number of check symbols in each message block.

Clause C4. The system of any of clauses C1-C3, wherein the protocol comprises an Ethernet protocol, the first codeword length comprises 544 symbols, and wherein each message block comprises 4 codewords of 136 symbols.

Clause C5. The system of any of clauses C1-C4, wherein the system comprises a data center system, and wherein the network comprises a backplane network.

Clause D1. An FEC encoder that generates variable length FEC codewords, the FEC encoder comprising:

parity circuitry comprising at least one configurable coefficient multiplier, wherein the parity circuitry is configured to generate a variable number of parity symbols, and wherein the configuration of the at least one configurable coefficient multiplier is based on the number of parity symbols; and message generating circuitry configured to concatenate the message and the generated parity symbols to produce an codeword.

Clause D2. The FEC encoder of clause D1, wherein the at least one configurable coefficient multiplier comprises a switch configured to select a value of the at least one configurable coefficient multiplier.

Clause D3. The FEC encoder of clause D2, wherein the codewords comprise a Reed-Solomon code, wherein the at least one configurable coefficient multiplier comprises a power of a fundamental root of a Galois Field associated with the Reed-Solomon code, and wherein the at least one coefficient multiplier is configured to operate on a partial syndrome of the message.

Clause D4. The FEC encoder of clause D3, wherein the number of produced parity symbols varies.

Clause D5. The FEC encoder of any of clauses D2-D4, configured to produce codewords in at least two FEC codeword formats comprising an RS (136, 128) format and an RS (136, 132) format.

Clause D6. The FEC encoder of any of clauses D1-D5, wherein the parity circuitry comprises:

forward substitution circuitry configured to receive a plurality of syndrome values and generate a plurality of forward values; and backward substitution circuitry configured to receive the plurality of forward values and generate the parity symbols; and wherein the forward substitution circuitry comprises the at least one configurable coefficient multiplier.

Clause D7. The FEC encoder of any of clauses D1-D6, comprising a cyclic redundancy check (CRC) circuitry configured to generate a CRC value for the codeword or the message.

Clause E1. A method to generate FEC codewords with variable number of check symbols, the method comprising:

selecting an encoding format, based at least in part on a number of check symbols, a number of symbols in a message, or a number of symbols in a codeword, or any combination thereof;

adjusting a set of coefficient multipliers of a forward substitution circuitry of the encoder based on the encoding format;

calculating, in the encoder, partial syndromes of a message using syndrome calculation circuitry;

calculating the check symbols for the message using, in part, the forward substitution circuitry; and producing, in the encoder, a codeword by concatenating the check symbols and the message.

Clause E2. The method of clause E1, comprising calculating, in the encoder, a cyclic redundancy check (CRC) symbol for the message and concatenating the CRC symbol to the message.

Clause E3. The method of any of clauses E1 or E2, comprising multiplying the partial syndromes of the message using the set of coefficient multipliers of the forward substitution circuitry.

Clause E4. The method of any of clauses E1-E3, wherein adjusting the set of coefficient multipliers comprise retrieving a multiplier values from a memory device of the encoder based on the encoding format.

Clause E5. The method of any of clauses E1-E4, wherein adjusting the set of coefficient multipliers comprise adjusting a switch that selects values for the set of coefficient multipliers.

Clause E6. The method of any of clauses E1-E5, comprising:
receiving, in a buffer, a plurality of codewords; and
assembling a message block by joining the plurality of codewords.

Clause E7. The method of clause E6, wherein the plurality of codeword consists of a codeword that comprises 544 symbols, and wherein each symbol comprises 10 bits.

Clause E8. The method of clause E7, wherein the plurality of codewords in the message block comprises four codewords comprising 136 symbols, and wherein each codeword comprise 4, 5, 6, 7, 8, or 9 check symbols.

Clause F1. A system comprising:
a network comprising a protocol that comprises a forward error correction (FEC) specification, wherein the FEC specification comprises a first codeword length;
a first electronic device coupled to the network, comprising an FEC encoder configured to produce a message block having the first codeword length, wherein the message block comprises a plurality of codewords, each codeword comprising an FEC codeword format, the FEC encoder comprising:
packet processing circuitry configured to receive an outgoing message and generate a plurality of short messages, each message associated with a respective codeword of the plurality of codewords;
encoding circuitry comprising a plurality of configurable coefficient multipliers, wherein, for each short message, the encoding circuitry is configured to:
configure the plurality of configurable coefficient multipliers based in part on the respective FEC codeword format associated with the codeword;
calculate respective parity symbols for each respective short message; and
concatenate the short message with the respective parity symbols to generate the respective codeword; and
block assembly circuitry configured to concatenate the plurality of codewords to produce the message block; and
a second electronic device coupled to the network, comprising an FEC decoder configured to process the message block comprising the plurality of codewords.

Clause F2. The system of clause F1, wherein the FEC encoder is configured to add a cyclic-redundancy check (CRC) symbol to the message block, and wherein the FEC decoder is configured to verify an integrity of the message block using the CRC symbol.

Clause F3. The system of any of clauses F1 or F2, wherein the first electronic device and the second electronic device comprise, each, a respective handshake circuitry configured to determine a number of codewords in each message block, a length of the codewords in each message block, and a number of check symbols in each message block.

Clause F4. The system of any of clauses F1-F3, wherein the protocol comprises an Ethernet protocol, the first codeword length comprises 544 symbols, and wherein each message block comprises 4 codewords of 136 symbols.

Clause F5. The system of any of clauses F1-F4, wherein the system comprises a data center system, and wherein the network comprises a backplane network.

What is claimed is:

1. A forward error correction (FEC) decoder configured to decode codewords of variable length, comprising:
packet processing circuitry configured to decompose a received message block into a plurality of short codewords, wherein each of the short codewords is shorter than the codeword;
error-detection circuitry configured to:
verify, for each short codeword of the plurality of short codewords, an integrity of the respective short codeword; and
produce, for each short codeword, a respective decoding message of a plurality of decoding messages based on the integrity of the respective short codeword, wherein the respective decoding message comprises a number of errors in the respective short word, a correction of the respective short word, or a corruption mark of the short codeword, or any combination thereof; and
block reconstruction circuitry configured to modify the received message block to produce a marked message block based on the plurality of decoding messages, wherein the marked message block comprises the received message block, a correction of the message block, a number of errors of the message block, or a message block corruption mark, or any combination thereof.

2. The FEC decoder of claim 1, wherein the codeword comprises an Ethernet message.

3. The FEC decoder of claim 1, wherein the block reconstruction circuitry is configured to combine the short words to provide the decoded word, wherein a length of the decoded word is the same as the length of an original codeword.

4. The FEC decoder of claim 1, wherein the packet processing circuitry is configured to decompose the message block in regularly sized short codewords.

5. The FEC decoder of claim 1, wherein a number of check symbols in the plurality of short codewords differ.

6. The FEC decoder of claim 1, wherein, for each decomposition of the message block into the plurality of short codewords, a number of check symbols in the plurality of codewords differ.

7. The FEC decoder of claim 1, wherein the error-detection circuitry is configured to determine a number of symbols in each short codeword and to determine a number of check symbols in each short codeword.

8. The FEC decoder of claim 1, wherein the FEC decoder is configured to decode an FEC code that comprises a Reed-Solomon code, and wherein producing the respective short word associated with each short codeword comprises comparing a number of error locations with a length of an error-locating polynomial associated with the short codeword.

9. The FEC decoder of claim 1, wherein at least one short codeword of the plurality of short words comprises a cyclic-redundancy check (CRC) symbol, and wherein the error-detection circuitry is configured to calculate a CRC value for each short word.

10. A method to verify errors in a message block comprising a plurality of FEC codewords with variable length, comprising:

separating each FEC codeword in the message block;

for each FEC codeword, determining a respective block length and a respective number of check symbols;

for each FEC codeword, determining a respective number of errors;

for each FEC codeword, producing a respective short word of a plurality of short words, wherein each respective short word comprises the respective FEC codeword, a correction of the respective FEC codeword, or a corruption mark, or any combination thereof; and generating a corrected message block based at least in part on the plurality of short words, wherein the corrected message block comprises the message block, a correction of the message block, or a corruption mark, or any combination thereof.

11. The method of claim 10, wherein generating the corrected message block comprises concatenating the plurality of short words.

12. The method of claim 10, wherein determining the respective block length and the respective number of check symbols for each FEC codeword comprises retrieving a header of the respective FEC codeword, a header of the message block, or a combination thereof.

13. The method of claim 10, the FEC codewords comprise a Reed-Solomon encoding, and wherein determining the respective number of errors for each FEC codeword comprises calculating a list of syndromes from the respective FEC codeword.

14. The method of claim 10, wherein each FEC codeword of the plurality of FEC codewords comprises a cyclic-redundancy check (CRC) symbol, and the method comprises:

for each FEC codeword, determining a respective CRC value; and for each FEC codeword, comparing the respective CRC value with the respective CRC symbol;

wherein producing the respective short word for each FEC codeword comprises adding a corruption mark to the respective short word based on a difference between the respective CRC value and the respective CRC symbol.

15. The method of claim 10, wherein the plurality of codewords consists of one codeword that comprises 544 symbols, and wherein each symbol comprises 10 bits.

16. The method of claim 15, wherein the plurality of codewords consists of two codewords comprising 272 symbols, and each codeword comprises 15 check symbols.

17. The method of claim 15, wherein the plurality of codewords consists of four codewords comprising 136 symbols, and wherein each codeword comprises 4, 5, 6, 7, 8, or 9 check symbols.

18. A system comprising:

a network comprising a protocol that comprises a forward error correction (FEC) specification, wherein the FEC specification comprises a first codeword length;

a first electronic device coupled to the network, comprising an FEC encoder configured to produce a message block having the first codeword length, wherein the message block comprises a plurality of codewords of a smaller length; and a second electronic device coupled to the network, comprising an FEC decoder configured to receive the message block from the first electronic device, wherein the FEC decoder of the second electronic device comprises:

packet processing circuitry configured to receive the message block and separate the plurality of codewords;

error-detection circuitry configured to produce a respective decoded word of a plurality of decoded words for each codeword based on the FEC code; and message reconstruction circuitry configured to produce a decoded message block by merging the plurality of decoded words.

19. The system of claim 18, wherein the FEC encoder is configured to add a cyclic-redundancy check (CRC) symbol to the message block, and wherein the FEC decoder is configured to verify an integrity of the message block using the CRC symbol.

20. The system of claim 18, wherein the first electronic device and the second electronic device each comprises, respectively, handshake circuitry, wherein each respective handshake circuitry is configured to determine a number of codewords in each message block, a length of the codewords in each message block, and a number of check symbols in each message block.

21. The system of claim 18, wherein the protocol comprises an Ethernet protocol, the first codeword length comprises 544 symbols, and wherein each message block comprises 4 codewords of 136 symbols.

22. The system of claim 18, wherein the system comprises a data center system, and wherein the network comprises a backplane network.

* * * * *